(12) United States Patent
Takata

(10) Patent No.: US 10,277,191 B2
(45) Date of Patent: Apr. 30, 2019

(54) COMPOSITE FILTER APPARATUS, HIGH-FREQUENCY FRONT END CIRCUIT, AND COMMUNICATION APPARATUS

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/049,852

(22) Filed: Jul. 31, 2018

(65) Prior Publication Data

US 2019/0044492 A1    Feb. 7, 2019

(30) Foreign Application Priority Data

Aug. 3, 2017    (JP) ................... 2017-150794
Jun. 20, 2018    (JP) ................... 2018-117003

(51) Int. Cl.
*H04B 1/44*    (2006.01)
*H04B 1/46*    (2006.01)
*H03H 7/075*    (2006.01)
*H03H 7/01*    (2006.01)
(Continued)

(52) U.S. Cl.
CPC ............... *H03H 7/075* (2013.01); *H03F 3/19* (2013.01); *H03H 7/0115* (2013.01); *H03H 7/0161* (2013.01); *H04B 1/0057* (2013.01); *H03F 2200/165* (2013.01); *H03F 2200/451* (2013.01)

(58) Field of Classification Search
CPC ........ H03H 7/09; H03H 7/075; H03H 7/0153; H03H 7/175; H03H 7/463; H03H 7/1758; H03H 7/1766; H03H 9/605; H03H 9/706; H03H 9/6483; H03F 2200/165; H03F 2200/451; H04B 1/04; H04B 1/0057; H04B 1/50
USPC ............... 455/73, 78, 82, 339, 552.1, 553.1; 333/133, 193, 195
See application file for complete search history.

(56) References Cited

U.S. PATENT DOCUMENTS 7,573,354 B2 *   8/2009   Nishihara ............... H03H 9/605
                                                                      333/133
8,040,205 B2 *   10/2011   Hatano ................ H03H 9/0571
                                                                        333/133

(Continued)

FOREIGN PATENT DOCUMENTS

JP          2008-294780 A    12/2008

*Primary Examiner* — Quochien B Vuong
(74) *Attorney, Agent, or Firm* — Keating & Bennett, LLP

(57) ABSTRACT

A composite filter apparatus includes a common terminal, a transmission-side terminal, a reception-side terminal, a transmission filter, and a reception filter with a pass band higher than the pass band of the transmission filter. The transmission filter is connected between the common terminal and the transmission-side terminal and the reception filter is connected between the common terminal and the reception-side terminal. An inductor is provided between the common terminal and the reception filter in a path between the common terminal and the reception-side terminal. The resonant frequency of a parallel-arm resonator closest to the common terminal in the reception filter is lower than a high end frequency of the pass band of the transmission filter and is lower than the resonant frequencies of the other parallel-arm resonators in the reception filter.

20 Claims, 11 Drawing Sheets

(51) Int. Cl.
*H03F 3/19* (2006.01)
*H04B 1/00* (2006.01)

(56) References Cited

U.S. PATENT DOCUMENTS

| | | | | |
|---|---|---|---|---|
| 9,035,722 | B2* | 5/2015 | Hara | H03H 9/725 |
| | | | | 333/133 |
| 9,148,119 | B2* | 9/2015 | Iwaki | H03H 9/14594 |
| 9,762,209 | B2* | 9/2017 | Takamine | H03H 9/6433 |
| 2011/0128092 | A1 | 6/2011 | Fritz et al. | |

* cited by examiner

# COMPOSITE FILTER APPARATUS, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2017-150794 filed on Aug. 3, 2017 and Japanese Patent Application No. 2018-117003 filed on Jun. 20, 2018. The entire contents of each of these applications are hereby incorporated herein by reference.

BACKGROUND OF THE INVENTION

1. Field of the Invention

The present invention relates to a composite filter apparatus including multiple filters, a high-frequency front end circuit, and a communication apparatus.

2. Description of the Related Art

Multiband mobile communication apparatuses that support multiple frequency bands using one terminal have been required in recent years. In order to meet such a requirement, composite filter apparatuses in which multiple filters having different pass bands are connected to one antenna have been developed.

As an example of such a composite filter apparatus, Japanese Unexamined Patent Application Publication No. 2008-294780 discloses a demultiplexer in which a first filter and a second filter having a pass band higher than that of the first filter are connected to a transmission-reception common terminal. Each of the first filter and the second filter includes series-arm resonators and parallel-arm resonators disposed between the series-arm resonators and ground. A phase shifter is connected between the transmission-reception common terminal and the first filter.

As described in Japanese Unexamined Patent Application Publication No. 2008-294780, when the second filter is connected to the common terminal with the first filter, a portion of a signal passing through the first filter may leak into the second filter side. This is because an inductance component of the phase shifter is decreased in the pass band of the first filter, which is lower than the pass band of the second filter and, thus, the impedance of the second filter is likely to be decreased when the second filter is viewed from the common terminal side. The low impedance may cause a signal leaking into the second filter in the pass band of the first filter.

In order to prevent the leakage of a signal, the inductance component of the phase shifter is increased and the impedance of the second filter, viewed from the common terminal side, is sufficiently increased (is set to an open state) in the pass band of the first filter. In other words, at least one of a real number component and an imaginary number component of normalized impedance is made infinite. However, since increasing the inductance component of the phase shifter increases the insertion loss of the phase shifter, the loss in the pass band of the second filter may be increased.

SUMMARY OF THE INVENTION

Preferred embodiments of the present invention provide composite filter apparatuses in which the loss in the pass band of each filter is easily decreased, high-frequency front end circuits, and communication apparatuses.

According to a preferred embodiment of the present invention, a composite filter apparatus includes a common terminal, a first terminal, a second terminal, a first filter that is connected between the common terminal and the first terminal and that has a first pass band, a second filter that is connected between the common terminal and the second terminal and that has a second pass band higher than the first pass band, and a first inductor that is provided between the common terminal and the second filter. The second filter includes one or more series-arm circuits and two or more parallel-arm resonators. The one or more series-arm circuits are connected in a path between the common terminal and the second terminal in series to each other. The two or more parallel-arm resonators include a first parallel-arm resonator that is connected to a node in a path between a first series-arm circuit closest to the common terminal, among the series-arm circuits, and the first inductor and to a reference terminal, and one or more other parallel-arm resonators that are connected to nodes in a path between the first series-arm circuit and the second terminal and to the reference terminal. An anti-resonant frequency of the first parallel-arm resonator is within the second pass band. A resonant frequency of the first parallel-arm resonator is lower than a high end frequency of the first pass band and is lower than any resonant frequencies of the one or more other parallel-arm resonators.

With the above-described configuration, the impedance of the second filter, viewed from the common terminal side, is capable of being adjusted so as to be close to the open state using both the inductance component of the first inductor, which advances the phase of the impedance, and the inductance component of the first parallel-arm resonator. Accordingly, the inductance component of the element is reduced, compared to the case in which the phase is adjusted using only the inductance component of the element to advance the phase. Consequently, it is possible to reduce the loss in the pass band of the first filter without increasing the loss in the pass band of the second filter.

Providing an inductor that is capable of being provided with wiring as the element that advances the phase reduces the size of the composite filter apparatus, compared to the case in which the phase shifter is provided.

The second filter preferably includes a first parallel-arm resonant circuit. The first parallel-arm resonant circuit preferably includes a second inductor provided in a path between the first parallel-arm resonator and the reference terminal to which the first parallel-arm resonator is connected.

With the above-described configuration, the first parallel-arm resonant circuit having a resonant frequency lower than the resonant frequency of the first parallel-arm resonator is provided in the second filter. The inductance component of the first parallel-arm resonant circuit is greater than that of the first parallel-arm resonator alone. Accordingly, since the phase of the impedance of the second filter, viewed from the common terminal side, is further advanced in the pass band of the first filter to be close to the open state, it is possible to further reduce the loss in the pass band of the first filter.

The second inductor is preferably provided only on the path between the first parallel-arm resonator and the reference terminal to which the first parallel-arm resonator is connected.

With the above-described configuration, the magnitude of the inductance component of the second inductor to be applied to the first parallel-arm resonator is increased, compared to that in the case in which an inductor is connected to the two or more parallel-arm resonators in the other parallel-arm resonators. In other words, since the inductance component of the first parallel-arm resonant circuit is further increased in the above configuration, the phase of the impedance of the second filter is greatly advanced clockwise on a Smith chart. Accordingly, since the impedance is closer to the open state in the pass band of the first filter, it is possible to further reduce the loss in the pass band of the first filter.

The resonant frequency of the first parallel-arm resonant circuit is preferably lower than a low end frequency of the first pass band.

With the above-described configuration, the inductance component of the first parallel-arm resonant circuit is increased to an extent in which the entire pass band of the first filter is inductive. Accordingly, the phase of the impedance of the second filter, viewed from the common terminal side, is greatly advanced on the Smith chart in the pass band of the first filter. In other words, since the impedance is closer to the open state in the pass band of the first filter, it is possible to further reduce the loss in the pass band of the first filter.

In the composite filter apparatus, at least a portion of impedance when the second filter alone is viewed from the common terminal side is preferably in the open state in the first pass band.

The first filter preferably includes multiple resonators. Among the multiple resonators in the first filter, the resonator closest to the common terminal is preferably a series-arm resonator.

The parallel-arm resonators, among the resonators in the filter, define bandpass characteristics (the pass band and an attenuation band) at the low frequency side of the filter. When the parallel-arm resonator is disposed closest to the common terminal in the first filter, the impedance of the first filter, viewed from the common terminal side, is lower than the open state in the pass band of the second filter, which is higher than the pass band of the first filter. Since the loss of the second filter is increased in such a configuration, the element which advances the phase of the impedance must be provided between the common terminal and the first filter to increase the impedance and prevent degradation of loss characteristics of the second filter.

In contrast, with the above-described configuration, the resonator closest to the common terminal is the series-arm resonator defining the bandpass characteristics (the pass band and the attenuation band) at the high frequency side of the filter. In this case, since the impedance of the first filter is increased in the pass band of the second filter, the signal in the pass band of the second filter is attenuated without providing the element between the common terminal and the first filter. Accordingly, it is possible to reduce the size of the composite filter apparatus, compared to the case in which the parallel-arm resonator is disposed closest to the common terminal.

The composite filter apparatus may further include a third terminal, a third filter that is connected between the common terminal and the third terminal and that has a third pass band higher than the second pass band, and a third inductor that is provided between the common terminal and the third filter. The third filter may include one or more series-arm circuits and two or more parallel-arm resonators. The one or more series-arm circuits in the third filter may be connected in a path between the common terminal and the third terminal in series to each other. The two or more parallel-arm resonators in the third filter may include a second parallel-arm resonator that is connected to a node in a path between a second series-arm circuit closest to the common terminal, among the one or more series-arm circuits in the third filter, and the third inductor and to the reference terminal, and one or more other parallel-arm resonators that are connected to nodes in a path between the second series-arm circuit and the third terminal and to the reference terminal. A fourth inductor may be provided in a path between the second parallel-arm resonator and the reference terminal to which the second parallel-arm resonator is connected. At least the second parallel-arm resonator and the fourth inductor may define a second parallel-arm resonant circuit. An anti-resonant frequency of the second parallel-arm resonant circuit may be within the third pass band. A resonant frequency of the second parallel-arm resonant circuit may be lower than the high end frequency of the first pass band and may be lower than the resonant frequencies of the one or more other parallel-arm resonators in the third filter.

In the composite filter apparatus in which at least three filters are collectively connected to the common terminal, two types of signals passing through the first filter and the second filter may leak into the third filter having the highest pass band, among the three filters. Providing the second inductor between the common terminal and the third filter causes the impedance of the third filter, viewed from the common terminal side, to be rotated clockwise on the Smith chart in both the pass band of the first filter and the pass band of the second filter to advance the phase.

Here, with the above-described configuration, the phase of the impedance of the third filter is capable of being advanced using both the inductance component of the second inductor and the inductance component of the second parallel-arm resonator closest to the common terminal to make the impedance close to the open state.

The connection of the fourth inductor to the second parallel-arm resonator enables the second parallel-arm resonant circuit including an inductance component greater than that of the second parallel-arm resonator alone to be provided. Here, if the inductance component is increased to an extent in which both the pass band of the second filter and the pass band of the first filter, which is lower than the pass band of the second filter, are inductive, the phase of the impedance in both of the pass bands is capable of being advanced closer to the open state. Accordingly, with the above-described configuration, it is possible to reduce the loss in the pass band of each filter in the composite filter apparatus including three or more filters.

The resonant frequency of the second parallel-arm resonant circuit is preferably lower than the low end frequency of the first pass band.

With the above-described configuration, the inductance component of the second parallel-arm resonant circuit in the third filter is increased to an extent in which the entire pass band of the first filter, which is lower than the pass band of the second filter, is inductive. Accordingly, since the phase of the impedance is capable of being advanced in the pass bands of the first filter and the second filter to be close to the open state, it is possible to further reduce the loss in the pass band of the third filter.

According to a preferred embodiment of the present invention, a high-frequency front end circuit includes a composite filter apparatus according to a preferred embodiment of the present invention and an amplifier circuit connected to the composite filter apparatus.

According to a preferred embodiment of the present invention, a communication apparatus includes a radio-frequency signal processing circuit that processes high-frequency signals transmitted and received with an antenna element and a high-frequency front end circuit according to a preferred embodiment of the present invention that transfers the high-frequency signals between the antenna element and the radio-frequency signal processing circuit.

With composite filter apparatuses, high-frequency front end circuits, and communication apparatuses according to preferred embodiments of the present invention, it is possible to easily reduce the loss in the pass band of each filter in the composite filter apparatuses, the high-frequency front end circuits, and the communication apparatuses.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to the drawings. The preferred embodiments described below indicate comprehensive or specific examples. Numerical values, shapes, components, the arrangement of the components, the connection mode of the components, and other elements and features, which are indicated in the preferred embodiments described below, are only examples and are not intended to limit the present invention. Among the components in the preferred embodiments described below, the components that are not described in the independent claims may be described as optional components.

First Preferred Embodiment

A composite filter apparatus according to a first preferred embodiment of the present invention will now be described with reference to FIG. 1 to FIG. 9, using a duplexer that is applied to Band25 (transmission pass band: about 1,850 MHz to about 1,915 MHz and reception pass band: about 1,930 MHz to about 1,995 MHz) as an example.

First Example

Figure 1:
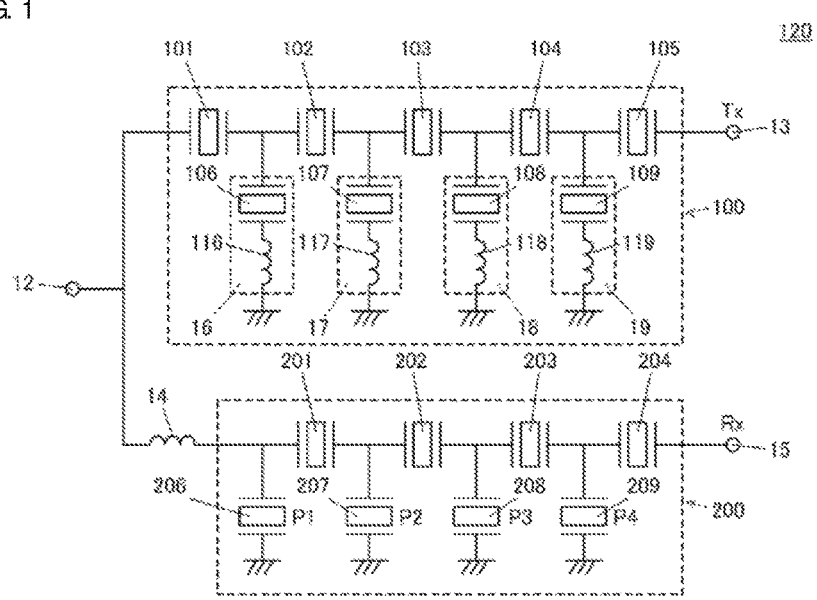
FIG. 1 is a circuit diagram illustrating an exemplary circuit configuration of a composite filter apparatus according to a first example of a first preferred embodiment of the present invention.

FIG. 1 is a circuit diagram illustrating an exemplary circuit configuration of a composite filter apparatus 120 according to a first example of the first preferred embodiment of the present invention. Referring to FIG. 1, the composite filter apparatus 120 includes a common terminal 12, a transmission-side terminal 13, an inductor 14, a reception-side terminal 15, a transmission filter 100, and a reception filter 200. The composite filter apparatus 120 is connected to, for example, an antenna element (not illustrated) via the common terminal 12.

The transmission filter 100 is preferably a band pass filter that performs filtering of a transmission signal generated in a transmission circuit (a radio frequency integrated circuit (RFIC) or other suitable circuit, for example) in the Band25 transmission pass band (about 1,850 MHz to about 1,915 MHz). The transmission signal is input into the transmission filter 100 through the transmission-side terminal 13 and then is supplied to the common terminal 12.

As illustrated in FIG. 1, the transmission filter 100 includes series-arm resonators 101 to 105, parallel-arm resonators 106 to 109, and inductors 116 to 119. The series-arm resonators 101 to 105 are provided in a path between the common terminal 12 and the transmission-side terminal 13. The parallel-arm resonators 106 to 109 are provided on paths between nodes on the path connecting the common terminal 12 to the transmission-side terminal 13 and a reference terminal (ground). Among the multiple resonators 101 to 109, the resonator closest to the common terminal 12 is the series-arm resonator 101. "Being closest to the common terminal" in the present application means "being closest to the common terminal in terms of an electric circuit". In addition, the inductors 116 to 119 are connected to the parallel-arm resonators 106 to 109, respectively, and the reference terminal and define parallel-arm resonant circuits 16 to 19 along with the parallel-arm resonators 106 to 109, respectively.

The reception filter 200 is preferably a band pass filter that performs filtering of a reception signal received with, for example, the antenna element (not illustrated) in the Band25 reception pass band (about 1,930 MHz to about 1,995 MHz), which is a frequency band higher than the Band25 transmission pass band. Here, the reception signal is supplied from the common terminal 12 to the reception filter 200 and then is supplied to the reception-side terminal 15. The inductor 14 is provided between the common terminal 12 and the reception filter 200 in a path between the common terminal 12 and the reception-side terminal 15.

As illustrated in FIG. 1, the reception filter 200 includes series-arm resonators 201 to 204 and parallel-arm resonators 206 to 209. Although all series-arm circuits are the series-arm resonators in FIG. 1, for example, a longitudinally coupled filter unit may preferably be used as the series-arm circuit. The series-arm resonators 201 to 204 are provided in the path between the common terminal 12 and the reception-side terminal 15. The parallel-arm resonators 206 to 209 are provided on paths between nodes on the path connecting the common terminal 12 to the reception-side terminal 15 and the reference terminal (ground). The parallel-arm resonator 206 is provided in a path between a node in a path connecting the series-arm resonator 201 closest to the common terminal 12, among the series-arm resonators 201 to 204, to the inductor 14 and the reference terminal. The parallel-arm resonators 207 to 209 are provided on paths between nodes in a path connecting the series-arm resonator 201 to the reception-side terminal 15 and the reference terminal. In other words, among the multiple resonators 201 to 204 and 206 to 209 in the reception filter 200, the resonator closest to the common terminal 12 is the parallel-arm resonator 206.

In the reception filter 200 in the composite filter apparatus 120 according to the first preferred embodiment, (1) the inductor 14 is provided between the common terminal 12 and the reception filter 200, (2) the resonant frequency of the parallel-arm resonator 206 is lower than a high end frequency in the pass band of the transmission filter 100, and (3) the resonant frequency of the parallel-arm resonator 206 is lower than the resonant frequency of any of the other parallel-arm resonators 207 to 209.

In the composite filter apparatus 120 having the above-described configurations, it is possible to reduce the loss in the pass band of the transmission filter 100 without degrading the loss in the pass band of the reception filter 200.

In the composite filter apparatus in which the multiple filters having different pass bands are collectively connected to the common terminal, as in the first preferred embodiment, the filters have an impact on one another to degrade bandpass characteristics. In particular, a problem may likely occur in that a portion of a signal passing through the filter having a relatively low pass band (hereinafter referred to as a lower-side filter), among the multiple filters, leaks into the filter having a relative high pass band (hereinafter referred to as a higher-side filter) to degrade the loss in the pass band of the low pass filter.

This problem occurs because the impedance of the high pass filter, viewed from the common terminal side, is not increased to a sufficiently high value in the pass band of the low pass filter (is not in an open state). The low impedance causes a signal that leaks into the high pass filter in the pass band of the low pass filter.

The low impedance of the high pass filter in the pass band of the low pass filter is caused by the fact that the resonant frequency of the resonators, and not the anti-resonant frequency of the resonators, defines an attenuation band at the low frequency side of the filter.

In the filter including the resonators, the attenuation band at the high frequency side of the pass band is provided using the anti-resonant frequency of the resonators while the attenuation band at the low frequency side of the pass band is provided using the resonant frequency of the resonators. The filter including such resonators is affected by the capacitance component and the inductance component of the resonators in its pass band and attenuation band. Specifically, the frequency band lower than the resonant frequency of the resonators and the frequency band higher than the anti-resonant frequency of the resonators are affected by the capacitance component to be capacitive bands. In contrast, the frequency band between the resonant frequency and the anti-resonant frequency is affected by the inductance component to be an inductive band.

Here, in the inductive band, the frequency band closer to the anti-resonant frequency is greatly affected by the inductance component so as to be more inductive and the frequency band closer to the resonant frequency is less affected by the inductance component so as to be less inductive. Accordingly, in the composite filter apparatus including the multiple filters, the impedance of each filter, viewed from the common terminal side, is likely to be high (to be closer to the open state) in the attenuation band at the high frequency side of the pass band where the inductive property is relatively strong. In contrast, the impedance of each filter, viewed from the common terminal side, is likely to be low (to be closer to a short state) in the attenuation band at the low frequency side of the pass band where the inductive property is relatively weak. Consequently, the impedance of the high pass filter is likely to be low in the pass band of the low pass filter.

In order to overcome the above-described problem, it is preferable to connect an element that advances the phase of the impedance between the common terminal and the high pass filter in the composite filter apparatus in which the multiple filters are connected. Connection of such an element causes the impedance of the high pass filter, viewed from the common terminal side, to be rotated clockwise on a Smith chart in the pass band of the low pass filter to advance the phase. Advancing the impedance of the high pass filter to the open state as described above enables leaking of a signal from the low pass filter to be reduced or prevented. Accordingly, with the composite filter apparatus having the above-described configuration (1), it is possible to improve the loss in the pass band of the low pass filter. When an inductor that is capable of being defined by wiring is used as the above-described element, the composite filter apparatus may be reduced in size, compared to the case in which the phase shifter is provided.

The phase of the impedance is more advanced as the inductance component of the above element is increased. However, increasing the inductance component of the element increases the insertion loss of the element. Since the element is provided on the path between the common terminal and the input-output terminal to which the high pass filter is connected, increasing the insertion loss of the element increases the loss of the signal passing on the path to increase the loss in the pass band of the high pass filter.

In contrast, the composite filter apparatus according to the first preferred embodiment of the present invention advances the phase of the impedance using the inductance component of the parallel-arm resonator closest to the common terminal, in addition to the inductance component of the above element. Accordingly, it is possible to reduce the loss in the pass band of the high pass filter.

In the filter including the multiple parallel-arm resonators, the capacitance component or the inductance component of the parallel-arm resonator closest to the common terminal, among the multiple parallel-arm resonators, the pass band and the attenuation band of the filter are the capacitive bands or the inductive bands. In other words, the frequency band between the resonant frequency and the anti-resonant frequency of the parallel-arm resonator closest to the common terminal is the inductive band.

Accordingly, if the resonant frequency of the parallel-arm resonator closet to the common terminal is lower than the high end frequency, which is the highest frequency in the frequencies used as the pass band, in the pass band of the low pass filter, a portion of the pass band of the low pass filter is the inductive band. In this case, the impedance of the high pass filter, viewed from the common terminal side, is rotated clockwise on the Smith chart in the pass band of the low pass filter to advance the phase. The phase is more advanced as the inductive band is increased in the pass band of the low pass filter, that is, as the inductance component of the parallel-arm resonator is increased.

Since the phase of the impedance of the high pass filter is capable of being advanced using both of the inductance component of the element and the inductance component of the parallel-arm resonator, as described above, the impedance is capable of being increased to the open state without increasing the inductance component of the above element. Accordingly, with the composite filter apparatus having the above-described configuration (2), in addition to the above-described configuration (1), it is possible to reduce not only the loss in the pass band of the low pass filter but also the loss in the pass band of the high pass filter.

Since the frequency band between the resonant frequency and the anti-resonant frequency of the parallel-arm resonator closest to the common terminal is the inductive band, the inductive band is widened to increase the inductance component as the parallel-arm resonator closest to the common terminal has a lower resonant frequency. In other words, when the resonant frequency of the parallel-arm resonator closest to the common terminal is lower than the resonant frequencies of the other parallel-arm resonators, the phase of the impedance is capable of being further advanced, compared to the case in which the resonant frequencies of the other parallel-arm resonators are lower than the resonant frequency of the parallel-arm resonator closest to the common terminal. Accordingly, with the composite filter apparatus having the above-described configuration (3), in addition to the above-described configurations (1) and (2), it is possible to greatly improve the bandpass characteristics of the composite filter apparatus.

Advantages of the configuration (3) will now be described, in comparison between first and second comparative examples.

A composite filter apparatus according to the first comparative example will now be described. The composite filter apparatus according to the first comparative example differs from the composite filter apparatus 120 in that the composite filter apparatus according to the first comparative example does not have the configuration (3).

Table 1 indicates numerical values of the resonant frequencies and the anti-resonant frequencies of the parallel-arm resonators in the reception filters in the composite filter apparatuses in the first and second examples and the first and second comparative examples. In Table 1, the parallel-arm resonator closest to the common terminal (the parallel-arm resonator 206 in FIG. 1) is denoted by P1, the parallel-arm resonator second closest to the common terminal (the parallel-arm resonator 207 in FIG. 1) is denoted by P2, the parallel-arm resonator third closest to the common terminal (the parallel-arm resonator 208 in FIG. 1) is denoted by P3, and the parallel-arm resonator fourth closest to the common terminal (the parallel-arm resonator 209 in FIG. 1) is denoted by P4.

TABLE 1

| | Resonant frequency (MHz) | | | | Anti-resonant frequency (MHz) | | | |
|---|---|---|---|---|---|---|---|---|
| | P1 | P2 | P3 | P4 | P1 | P2 | P3 | P4 |
| First example | 1,879 | 1,914 | 1,911 | 1,909 | 1,950 | 1,971 | 1,967 | 1,981 |
| Second example | 1,831 | 1,914 | 1,911 | 1,909 | 1,950 | 1,971 | 1,967 | 1,981 |
| First comparative example | 1,910 | 1,914 | 1,911 | 1,909 | 1,981 | 1,971 | 1,967 | 1,981 |
| Second comparative example | 1,910 | 1,914 | 1,911 | 1,909 | 1,981 | 1,971 | 1,967 | 1,981 |

As indicated in Table 1, in the composite filter apparatus according to the first comparative example, the resonant frequency of the parallel-arm resonator P1 is lower than the high end frequency (about 1,915 MHz) of the transmission filter but is higher than the resonant frequency of the parallel-arm resonator P4. In other words, the composite filter apparatus according to the first comparative example does not have the above-described configuration (3).

In contrast, in the composite filter apparatus according to the first example, the resonant frequency of the parallel-arm resonator P1 is lower than the high end frequency of the transmission filter and is lowest in the resonant frequencies of the parallel-arm resonators P1 to P4. In other words, the composite filter apparatus according to the first example has the above-described configuration (3).

The anti-resonant frequencies of the parallel-arm resonator P1 are within the pass band (about 1,930 MHz to about 1,995 MHz) of the reception filter in both of the composite filter apparatuses according to the first example and the first comparative example. This is because the anti-resonant frequency of the parallel-arm resonator P1 defines the pass band of the reception filter.

Here, reflection characteristics (the impedance) and the bandpass characteristics of the composite filter apparatus according to the first example will be compared to the reflection characteristics (the impedance) and the bandpass characteristics of the composite filter apparatus according to the first comparative example. The characteristic impedance is set to about 50Ω, for example, in the Smith chart used in the following description. A left end at which the normalized impedance normalized with the characteristic impedance is about 0+0j indicates the short state (short). A center portion at which the normalized impedance is about 1+0j indicates an impedance matching state. A right end at which at least one of the real number component and the imaginary number component of the normalized impedance is made infinite indicates the open state (open).

Figure 2:
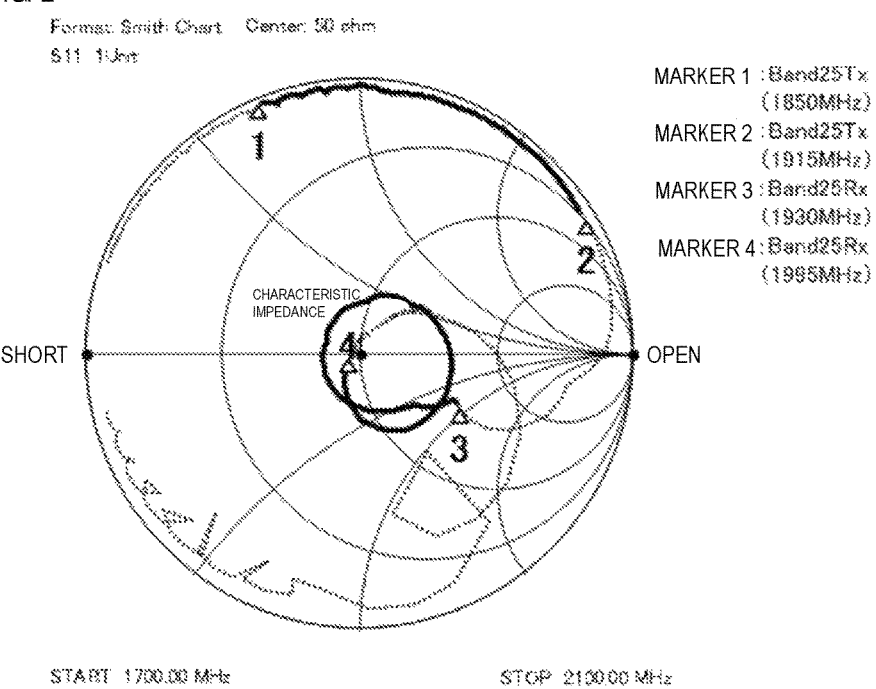
FIG. 2 is a Smith chart indicating the impedance when a reception filter is viewed from a common terminal in a composite filter apparatus according to a first comparative example.

FIG. 2 is a Smith chart indicating the impedance when the reception filter is viewed from the common terminal in the composite filter apparatus according to the first comparative example. The inductance value of the series inductor (the inductor 14 in FIG. 1) provided between the common terminal and the reception filter is set to about 4.7 nH in FIG. 2.

In the Smith chart in FIG. 2, the impedance of the reception filter applied to the Band25 reception pass band is greatly shifted from the open state in the entire Band25 transmission pass band to which the transmission filter is applied.

Figure 3:
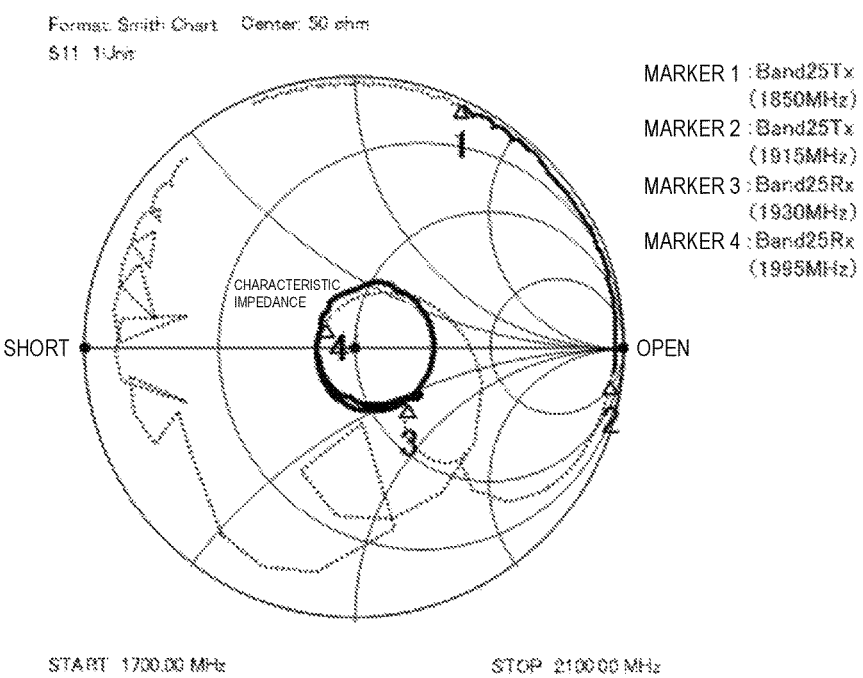
FIG. 3 is a Smith chart indicating the impedance when the reception filter is viewed from the common terminal in the composite filter apparatus according to the first example of the first preferred embodiment of the present invention.

In contrast, FIG. 3 is a Smith chart indicating the impedance when the reception filter is viewed from the common terminal in the composite filter apparatus according to the first example. The inductance value of the series inductor is preferably set to about 4.7 nH, for example, also in FIG. 3.

In the Smith chart in FIG. 3, the impedance of the reception filter is greatly rotated clockwise, compared to that in the first comparative example, in the Band25 transmission pass band to which the transmission filter is applied. In other words, the impedance of the reception filter is in the open state especially near the high end frequency (about 1,915 MHz) of the Band25 transmission pass band. This is because, since the composite filter apparatus according to the first example has the above-described configuration (3), in addition to the above-described configurations (1) and (2), the inductive band in the Band25 transmission pass band is increased, compared to that in the first comparative example. When the composite filter apparatus has the configuration (3) with the inductance value of the series inductor being fixed in the above-described manner, it is possible for the phase of the impedance to be closer to the open state.

Although the phase of the impedance of the reception filter is capable of being increased by increasing the inductance component of the series inductor without the configuration (3), the loss in the pass band of the reception filter is degraded in this case. This problem will now be described, in comparison between the first example and the second comparative example.

The composite filter apparatus according to the second comparative example differs from the composite filter apparatus according to the first comparative example in that the composite filter apparatus according to the second comparative example includes the series inductor having an inductance value of about 6.2 nH, which is greater than that in the first comparative example.

Figure 4:
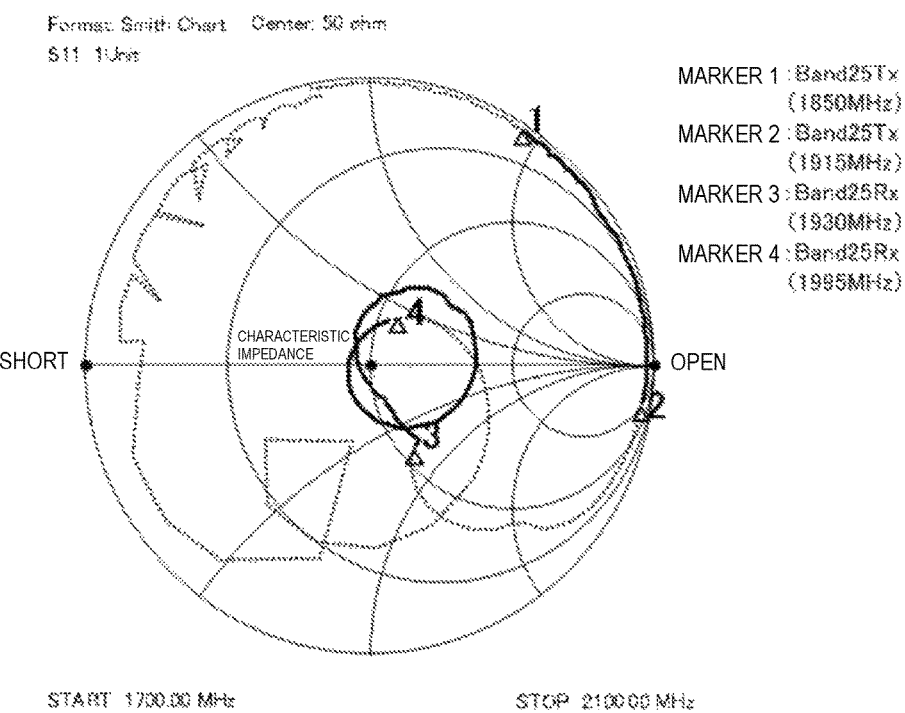
FIG. 4 is a Smith chart indicating the impedance when the reception filter is viewed from the common terminal in a composite filter apparatus according to a second comparative example.

FIG. 4 is a Smith chart indicating the impedance when the reception filter is viewed from the common terminal in the composite filter apparatus according to the second comparative example. The phase of the impedance of the reception filter is advanced in the Band25 transmission pass band to which the transmission filter is applied to the same or substantially the same extent as that in FIG. 3 also in FIG. 4.

However, in the composite filter apparatus according to the second comparative example, the inductance component of the series inductor is greater than that of the composite filter apparatus according to the first example. Accordingly, the bandpass characteristics in the pass band of the reception filter is degraded, compared to the bandpass characteristics in the pass band of the reception filter in the composite filter apparatus according to the first example.

Figure 5:
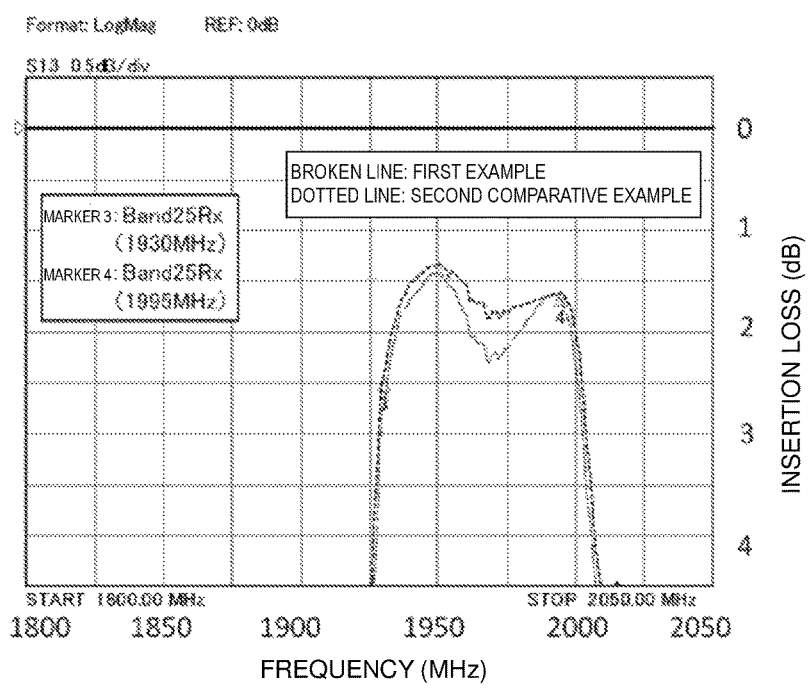
FIG. 5 is a diagram indicating bandpass characteristics of the reception filters in the composite filter apparatus according to the second comparative example and the composite filter apparatus according to the first example.

FIG. 5 is a diagram indicating the bandpass characteristics (broken line) of the composite filter apparatus according to the first example and the bandpass characteristics (dotted line) of the composite filter apparatus according to the second comparative example. Specifically, the bandpass characteristics of the path through the reception filter is indicated, and the insertion loss is indicated, which is the absolute value of an intensity ratio (S21) of a signal output from the reception-side terminal to a signal input through the common terminal.

Focusing on the composite filter apparatus according to the second comparative example in the pass band (the Band25 reception pass band) of the reception filter in FIG. 5, the loss is greatly degraded especially near the center frequency. In contrast, the composite filter apparatus according to the first example achieves a low loss, compared to the composite filter apparatus according to the second comparative example. In other words, with the composite filter apparatus having the above-described configuration (3), in addition to the above-described configurations (1) and (2), since the magnitude of the inductance component of the series inductor is able to be reduced when the phase of the impedance is advanced by a certain amount, the loss in the pass band of the reception filter is also above to be reduced.

As described above, with the composite filter apparatus having the above-described configurations (1), (2), and (3), it is possible to reduce the loss in the pass band of each filter in the composite filter apparatus to greatly improve the bandpass characteristics of the composite filter apparatus.

Other advantages of the composite filter apparatus 120 according to the first example of the first preferred embodiment will now be described.

In the transmission filter 100 in the composite filter apparatus 120, the resonator closest to the common terminal 12 is the series-arm resonator 101.

Among the resonators in each filter, the parallel-arm resonators define the attenuation band at the low frequency side of the filter. When such a resonator is disposed closest to the common terminal 12 in the transmission filter 100, the attenuation characteristics in the attenuation band at the high frequency side of the transmission filter 100 are degraded. In other words, since the impedance of the transmission filter 100, viewed from the common terminal 12 side, is greatly shifted from the open state in the pass band of the reception filter 200, which is higher than that of the transmission filter 100, the loss in the pass band of the reception filter 200 is degraded. In order to improve the loss, an element that advances the phase of the impedance may preferably be provided between the common terminal 12 and the transmission filter 100 to increase the impedance.

In contrast, in the transmission filter 100 in the composite filter apparatus 120 according to the first example, the series-arm resonator that defines the attenuation band at the high frequency side of the filter is arranged so as to be closest to the common terminal 12. Accordingly, the impedance in the frequency band higher than the pass band of the transmission filter 100 is increased without the connection of the above-described element. In other words, the impedance in the pass band of the reception filter 200, which is higher than the pass band of the transmission filter 100, is also increased. Accordingly, the leaking of the leakage signal from the reception filter 200 side is reduced or prevented to reduce or prevent the loss of the reception filter 200. Consequently, with the composite filter apparatus 120 according to the first example of the first preferred embodiment, it is possible to reduce the size of the composite filter apparatus 120.

Second Example

Figure 6:
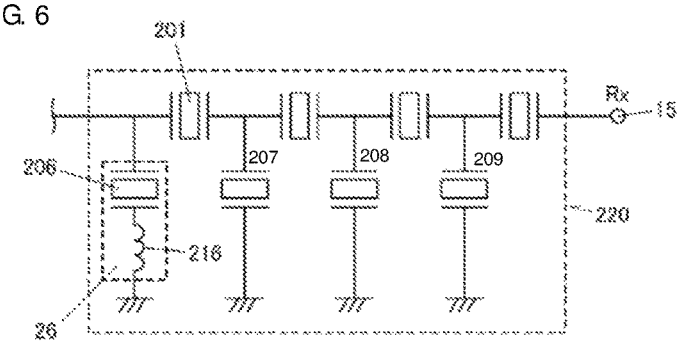
FIG. 6 is a circuit diagram illustrating an exemplary circuit configuration of a reception filter in a composite filter apparatus according to a second example of the first preferred embodiment of the present invention.

FIG. 6 is a circuit diagram illustrating an exemplary circuit configuration of a reception filter 220 provided in a path between the inductor 14 and the reception-side terminal 15 in a composite filter apparatus according to a second example of the first preferred embodiment of the present invention. Referring to FIG. 6, the reception filter 220 includes a parallel-arm resonant circuit 26 including the parallel-arm resonator 206 closest to the common terminal 12 and an inductor 216 connected to the parallel-arm resonator 206. The circuit configuration except for the reception filter 220 is the same or substantially the same as that of the composite filter apparatus 120 according to the first example.

Providing the parallel-arm resonant circuit 26 including the inductor 216 shifts the resonant frequency of the parallel-arm resonator P1 included in the parallel-arm resonant circuit 26 to the low frequency side, compared to that of the composite filter apparatus according to the first example, in the composite filter apparatus according to the second example. For example, referring to Table 1, the resonant frequency of the parallel-arm resonant circuit 26 including the parallel-arm resonator P1 (the parallel-arm resonator 206 in FIG. 6) closest to the common terminal 12 is lower than a low end frequency (about 1,850 MHz), which is the lowest frequency in the pass band of the transmission filter 100. Accordingly, the inductance component of the parallel-arm resonant circuit 26 is greater than that in the composite filter apparatus according to the first example and the phase of the impedance of the high pass filter, viewed from the common terminal side, is capable of being advanced to a point near the open state.

Figure 7:
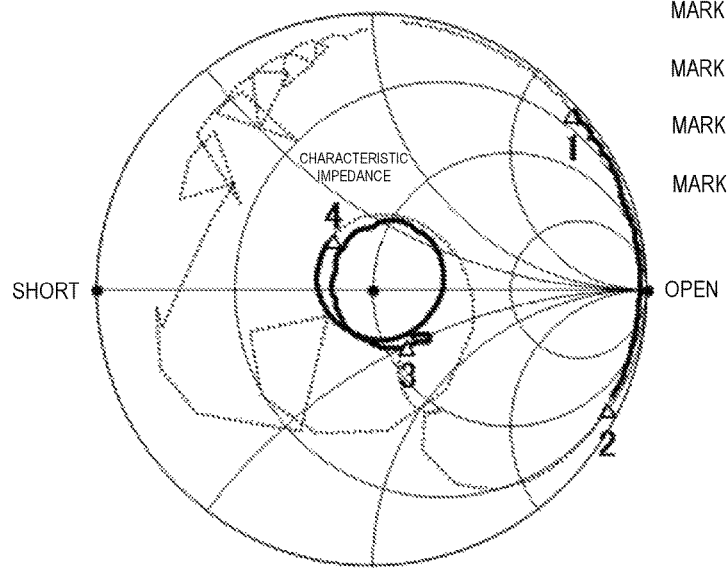
FIG. 7 is a Smith chart indicating the impedance when the reception filter is viewed from the common terminal in the composite filter apparatus according to the second example of the first preferred embodiment of the present invention.

FIG. 7 is a Smith chart indicating the impedance when the reception filter is viewed from the common terminal in the composite filter apparatus according to the second example. The inductance value of the series inductor provided between the common terminal and the reception filter is preferably set to about 4.7 nH, for example, as in the first example, in FIG. 7. The impedance of the reception filter is rotated to points near the open state not only at the high end frequency of the Band25 transmission pass band but also at the low end frequency thereof in FIG. 7. This is because, since the composite filter apparatus according to the second example has a configuration in which the resonant frequency of the parallel-arm resonator P1 is lower than the low end frequency of the Band25 transmission pass band, in addition to the above-described configurations (1) to (3), the entire Band25 transmission pass band is made inductive.

As described above, the leaking of the leakage signal from the transmission filter side is reduced or prevented as the impedance of the reception filter is closer to the open state in the pass band of the transmission filter to improve the bandpass characteristics in the pass band of the transmission filter.

Figure 8:
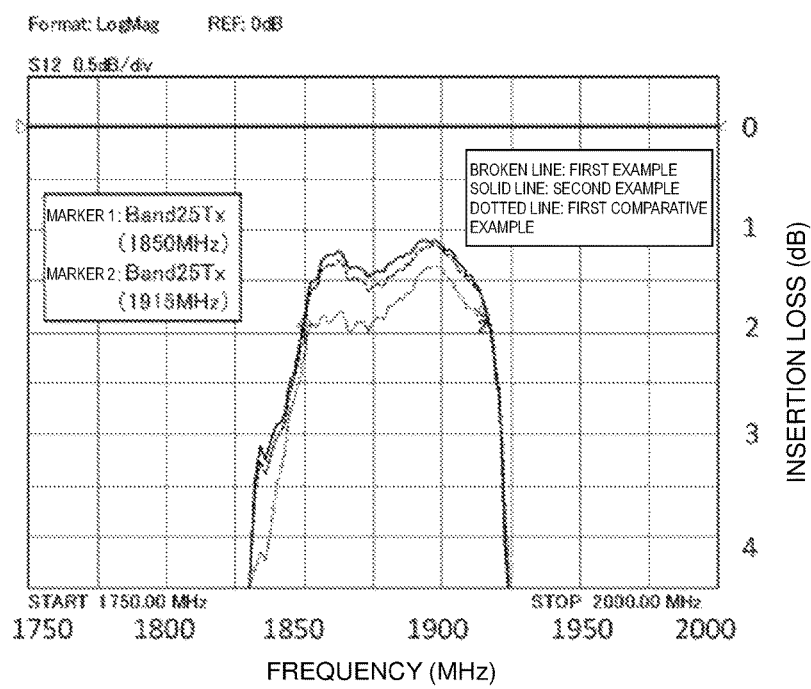
FIG. 8 is a diagram indicating the bandpass characteristics of transmission filters in the composite filter apparatuses according to the first comparative example and the first example and the second example of the first preferred embodiment of the present invention.

FIG. 8 is a diagram indicating the bandpass characteristics (broken line) of the composite filter apparatus according to the first example, the bandpass characteristics (solid line) of the composite filter apparatus according to the second example, and the bandpass characteristics (dotted line) of the composite filter apparatus according to the first comparative example. Specifically, the bandpass characteristics of the path through the transmission filter is indicated, and the insertion loss is indicated, which is the absolute value of the intensity ratio (S12) of a signal output from the common terminal to a signal input through the transmission-side terminal.

As illustrated in FIG. 8, the composite filter apparatus according to the second example has excellent bandpass characteristics, compared to those of the composite filter apparatus according to the first example, in the pass band of the transmission filter (the Band25 transmission pass band). In addition, since the impedance of the reception filter, viewed from the common terminal side, is in the open state in at least a portion of the transmission pass band in the composite filter apparatuses according to the first example and the second example, as illustrated in FIG. 3 and FIG. 7, the composite filter apparatuses according to the first example and the second example achieve the bandpass characteristics of low loss, compared to the composite filter apparatus according to the first comparative example.

As described above, with the composite filter apparatus according to the second example, it is possible to further reduce the loss in the pass band of the filter in the composite filter apparatus to further improve the bandpass characteristics of the composite filter apparatus.

In the composite filter apparatus according to the second example, the inductor 216 in the parallel-arm resonant circuit 26 in the reception filter 220 is provided only on the path between the parallel-arm resonator 206 and the reference terminal to which the parallel-arm resonator 206 is connected. In other words, the inductor 216 is connected to none of the other parallel-arm resonators 207 to 209 connected to the nodes on the path between the series-arm circuit (series-arm resonator) 201 closest to the common terminal and the reception-side terminal 15.

If the inductor 216 in the parallel-arm resonant circuit 26 closest to the common terminal 12 is connected to not only the parallel-arm resonator 206 but also any of the other parallel-arm resonators 207 to 209, the inductance component of the inductor 216 to be applied to each resonator is decreased, compared to a case in which the inductor 216 is connected to only one resonator provided at a specific position in the electric circuit.

In contrast, with the above-described configuration, since the inductance component of the inductor 216 is applied only to the parallel-arm resonator 206 in the parallel-arm resonant circuit 26 closest to the common terminal 12, the inductance component to be applied to the parallel-arm resonator 206 is increased. Accordingly, since the phase of the impedance of the reception filter 220 is greatly advanced on the Smith chart in the pass band of the transmission filter 100 to be close to the open state, the loss in the pass band of the transmission filter 100 is capable of being further reduced.

Modifications of Second Example

Composite filter apparatuses according to modifications of the second example of the first preferred embodiment of the present invention will now be described with reference to FIGS. 9A and 9B. Both of the composite filter apparatuses according to the modifications differ from the composite filter apparatuses according to the second example in the circuit configuration of the reception filter in the following manner.

First Modification

Figure 9A:
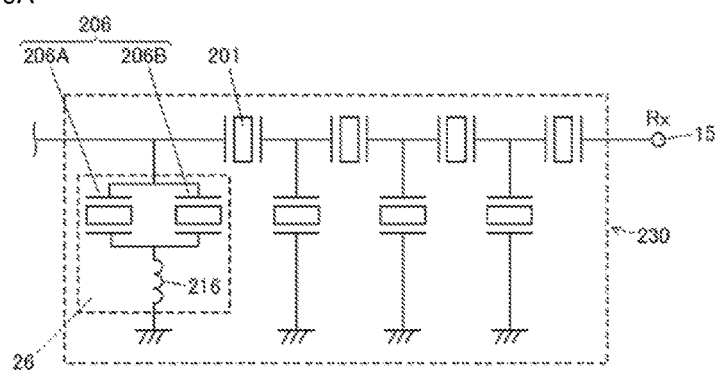
FIGS. 9A and 9B are circuit diagrams illustrating exemplary circuit configurations of first filters in the composite filter apparatus according to modifications of the first preferred embodiment of the present invention.

FIG. 9A is a circuit diagram illustrating an exemplary circuit configuration of a reception filter 230 in the composite filter apparatus 120 according to a first modification of the second example. Referring to FIG. 9A, the parallel-arm resonator 206 includes two parallel-arm resonators 206A and 206B. The resonator in the composite filter apparatus according to the first preferred embodiment may include multiple resonators connected to the path between the node to which the resonator is connected and the reference terminal to which the resonator is connected in the above manner.

When the parallel-arm resonator 206 closest to the common terminal 12 includes the multiple resonators, as shown in FIG. 9A, it is sufficient for the resonant frequency of at least one resonator, among the multiple resonators, to be lower than the resonant frequencies of the other parallel-arm resonators.

Second Modification

Figure 9B:
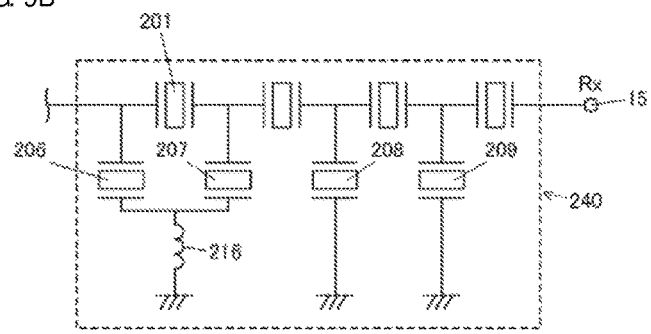

FIG. 9B is a circuit diagram illustrating an exemplary circuit configuration of a reception filter 240 in the composite filter apparatus 120 according to a second modification of the second example of the first preferred embodiment of the present invention. Referring to FIG. 9B, the inductor 216 defining the parallel-arm resonant circuit 26 with the parallel-arm resonator 206 closest to the common terminal 12 is preferably also connected to the parallel-arm resonator 207 second closest to the common terminal 12.

As in the second modification, the inductor 216 may also be connected to any of the parallel-arm resonators 207 to 209 second to fourth closest to the common terminal 12, respectively. Although the inductance component to be applied from the inductor 216 to the parallel-arm resonator 206 is reduced in the composite filter apparatus 120 of the second modification, the advantages of the present invention are sufficiently achieved.

Second Preferred Embodiment

A composite filter apparatus according to a second preferred embodiment of the present invention will now be described with reference to FIG. 10, using a triplexer that is preferably applied to Band25 and Band1 (reception pass band: about 2,110 MHz to about 2,170 MHz) as an example.

Figure 10:
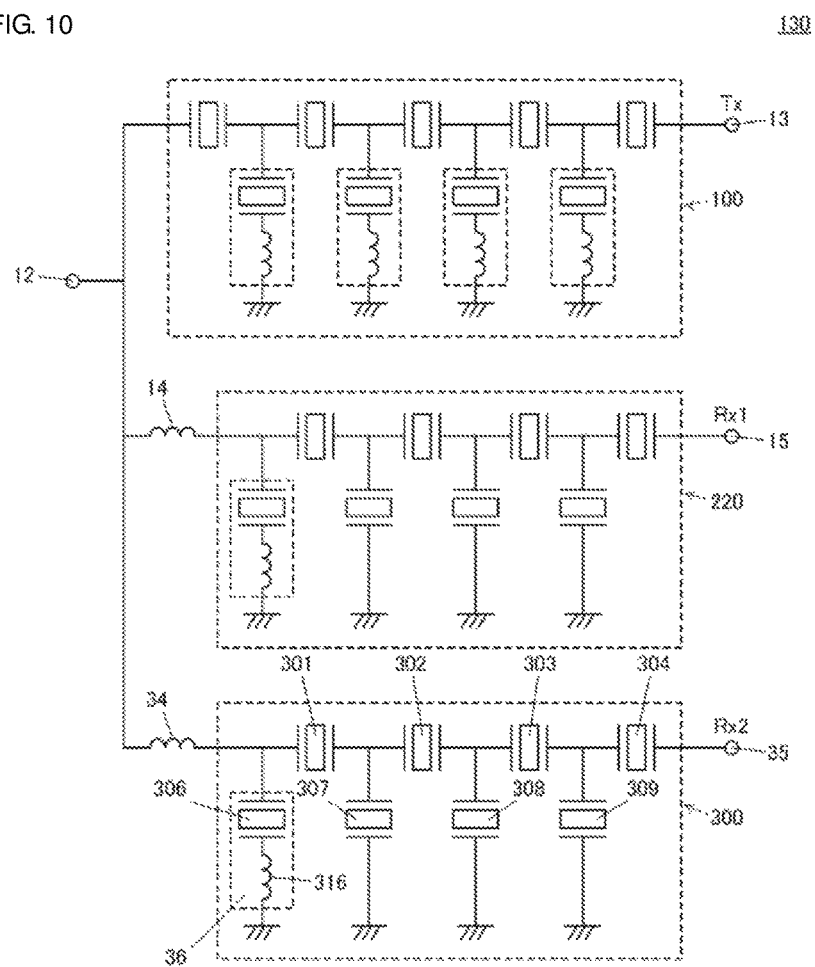
FIG. 10 is a circuit diagram illustrating an exemplary circuit configuration of a composite filter apparatus according to a second preferred embodiment of the present invention.

FIG. 10 is a circuit diagram illustrating an exemplary circuit configuration of a composite filter apparatus 130 according to the second preferred embodiment of the present invention. Referring to FIG. 10, the composite filter apparatus 130 further includes an inductor 34, a reception-side terminal 35, and a reception filter 300, compared to the composite filter apparatus 120 according to the second example of the first preferred embodiment.

The reception filter 300 is preferably a band pass filter that performs filtering of a reception signal received with, for example, the antenna element (not illustrated) in the Band1 reception pass band (about 2,110 MHz to about 2,170 MHz) higher than the Band25 reception pass band (about 1,930 MHz to about 1,995 MHz). Here, the reception signal is supplied from the common terminal 12 to the reception filter 300 and then is supplied to the reception-side terminal 35. The inductor 34 is provided between the reception filter 300 and the common terminal 12 in a path between the common terminal 12 and the reception-side terminal 35.

As in the reception filter 220, the reception filter 300 includes series-arm resonators 301 to 304 and parallel-arm resonators 306 to 309. Although all of the series-arm circuits are the series-arm resonators in FIG. 10, for example, a longitudinally coupled filter unit may preferably be used as the series-arm circuit.

The series-arm resonators 301 to 304 are provided on the path between the common terminal 12 and the reception-side terminal 35. The parallel-arm resonators 306 to 309 are provided on paths between nodes on the path connecting the common terminal 12 to the reception-side terminal 35 and the reference terminal.

The parallel-arm resonator 306 is provided in a path between a node in a path connecting the series-arm resonator 301 closest to the common terminal 12, among the series-arm resonators 301 to 304, to the inductor 34 and the reference terminal. The parallel-arm resonators 307 to 309 are provided on paths between nodes in a path connecting the series-arm resonator 301 to the reception-side terminal 35 and the reference terminal. In other words, among the multiple resonators in the reception filter 300, the resonator closest to the common terminal 12 is the parallel-arm resonator 306. The parallel-arm resonator 306 and an inductor 316, which is connected to the parallel-arm resonator 306 and the reference terminal, define a parallel-arm resonant circuit 36.

The resonant frequency of the parallel-arm resonant circuit 36 is shifted toward the low frequency side, compared to the resonant frequency of the parallel-arm resonator 306 alone, due to the inductor 316. Accordingly, the resonant frequency of the parallel-arm resonant circuit 36 is lower than the high end frequency (about 1,915 MHz) of the pass band of the transmission filter 100, which is the lowest pass band among the pass bands of the three filters, and is lower than the resonant frequencies of the parallel-arm resonators 307 to 309. In addition, the anti-resonant frequency of the parallel-arm resonant circuit 36 is within the pass band (about 2,110 MHz to about 2,170 MHz) of the reception filter 300.

In the reception filter 300 including a parallel-arm resonant circuit 36, at least a portion of the pass band of the transmission filter 100 and the entire pass band of the reception filter 220, which is in a frequency band higher than that of the transmission filter 100, are the inductive bands. Accordingly, the impedance of the reception filter 300, viewed from the common terminal 12, is capable of being greatly rotated clockwise on the Smith chart in the pass bands of the transmission filter 100 and the reception filter 220 using the parallel-arm resonant circuit 36 to advance the phase. In other words, it is possible to reduce the loss in the pass bands of the transmission filter 100 and the reception filter 220 without greatly degrading the loss of the reception filter 300.

At this time, if the resonant frequency of the parallel-arm resonant circuit 36 is lower than the low end frequency (about 1,850 MHz) of the pass band of the transmission filter 100, the entire pass band of the transmission filter 100 is the inductive band, in addition to the entire pass band of the reception filter 220. Accordingly, since the impedance of the reception filter 300, viewed from the common terminal 12, is capable of being greatly advanced in the pass band of the transmission filter 100, it is possible to further reduce the loss in the pass bands of the transmission filter 100 and the reception filter 220.

In the above-described triplexer, application of the configuration of the second preferred embodiment of the present invention to the filter having the highest pass band, among the three filters, enables the leaking of the signals from the multiple filters having the pass bands lower than that of the filter having the highest pass band to be reduced or prevented. In other words, with the above-described configuration, it is possible to achieve the low loss of the composite filter apparatus also when the composite filter apparatus includes three or more filters.

The composite filter apparatuses 120 and 130 described in the first preferred embodiment and the second preferred embodiment are applicable to high-frequency front end circuits and communication apparatuses, which include the composite filter apparatus 120 or 130. Such a high-frequency front end circuit and such a communication apparatus will now be described, using a configuration including the composite filter apparatus according to the second preferred embodiment as an example.

Figure 11:
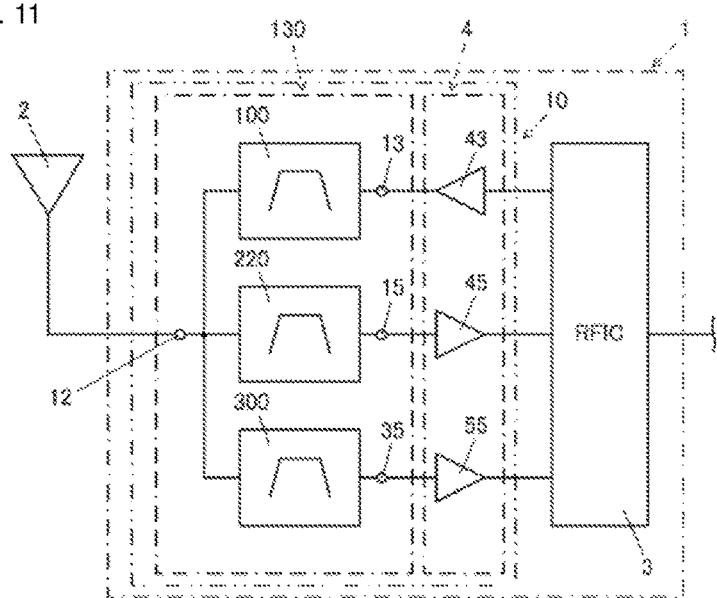
FIG. 11 is a diagram illustrating an exemplary configuration of a high-frequency front end circuit and a communication apparatus.

FIG. 11 is a diagram illustrating an exemplary configuration of a high-frequency front end circuit 10 including the composite filter apparatus 130 and a communication apparatus 1 including the high-frequency front end circuit 10. The high-frequency front end circuit 10 including the composite filter apparatus 130 and an amplifier circuit 4, an antenna element 2, and a radio-frequency (RF) signal processing circuit (RFIC) 3 are illustrated in FIG. 11. The high-frequency front end circuit 10 and the RFIC 3 define the communication apparatus 1. The antenna element 2, the high-frequency front end circuit 10, and the RFIC 3 are preferably disposed in, for example, a front end unit in a multimode-multiband cellular phone.

The antenna element 2 is preferably, for example, a multiband antenna conforming to a communication standard, such as Long Term Evolution (LTE), which transmits and receives high-frequency signals. The antenna element 2 may not support, for example, all of the frequency bands of the communication apparatus and may support only a low frequency band group or a high frequency band group. The antenna element 2 may be incorporated in the communication apparatus 1.

The RFIC 3 is an RF signal processing circuit that processes high-frequency signals transmitted and received with the antenna element 2. Specifically, the RFIC 3 preferably, performs signal processing, for example, down-conversion, of high-frequency signals supplied from the antenna element 2 via a reception-side signal path of the high-frequency front end circuit 10 and supplies a reception signal generated through the signal processing to a baseband signal processing circuit (not illustrated). In addition, the RFIC 3 preferably performs signal processing, for example, up-conversion of a transmission signal supplied from the baseband signal processing circuit and supplies a high-frequency signal generated through the signal processing to the transmission-side signal path of the high-frequency front end circuit 10.

The high-frequency front end circuit 10 transfers a high-frequency signal between the antenna element 2 and the RFIC 3. Specifically, the high-frequency front end circuit 10 transfers a high-frequency signal supplied from the RFIC 3 to the antenna element 2 via the transmission-side signal path. The high-frequency front end circuit 10 transfers a high-frequency signal received with the antenna element 2 to the RFIC 3 via the reception-side signal path.

The high-frequency front end circuit 10 sequentially includes the composite filter apparatus 130 and the amplifier circuit 4 from the antenna element 2 side.

The amplifier circuit 4 includes amplifiers 43, 45, and 55 that amplify the power of a high-frequency signal supplied from the composite filter apparatus 130 or the RFIC 3. In the present preferred embodiment, the amplifier 43 connected to the transmission-side terminal 13 is preferably a power amplifier and the amplifiers 45 and 55 connected to the reception-side terminals 15 and 35, respectively, are preferably low noise amplifiers, for example.

The high-frequency front end circuit 10 may include, for example, a switch that switches between transmission and reception or a switch used to share the low noise amplifier between the multiple filters composing the composite filter apparatus.

The high-frequency front end circuit 10 having the above-described configuration performs filtering of a high-frequency signal supplied from the antenna element 2 with the reception filter 220 or 300 and amplifies the high-frequency signal with the amplifiers 45 and 55 to supply the high-frequency signal to the RFIC 3. In addition, the high-frequency front end circuit 10 amplifies a high-frequency signal supplied from the RFIC 3 with the amplifier 43 and performs filtering with the transmission filter 100 to supply the high-frequency signal to the antenna element 2. An RFIC that supports the lower frequency band (Band25 here) and an RFIC that supports the higher frequency band (Band1 here) may preferably be separately provided.

As described above, the high-frequency front end circuit 10 is capable of obtaining the multiband high-frequency front end circuit that is capable of achieving excellent electrical characteristics (reducing or preventing the loss) due to the composite filter apparatus 130 according to the second preferred embodiment.

The high-frequency front end circuit may include the composite filter apparatus according to the first or second example of the first preferred embodiment or according to the first or second modification of the second example. The configuration including the composite filter apparatus connected to both of the transmission-side signal path and the reception-side signal path is described in the present preferred embodiment. However, the configuration of the high-frequency front end circuit is not limited to this, and the high-frequency front end circuit may have a configuration in which the composite filter apparatus is connected to either of the reception-side signal path and the transmission-side signal path.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter apparatus comprising:
    a common terminal;
    a first terminal;
    a second terminal;
    a first filter that is connected between the common terminal and the first terminal and that has a first pass band;
    a second filter that is connected between the common terminal and the second terminal and that has a second pass band higher than the first pass band; and
    a first inductor that is provided between the common terminal and the second filter; wherein
    the second filter includes one or more series-arm circuits and two or more parallel-arm resonators;
    the one or more series-arm circuits are connected in a path between the common terminal and the second terminal in series to each other;
    the two or more parallel-arm resonators include:
        a first parallel-arm resonator that is connected to a node in a path between a first series-arm circuit closest to the common terminal, among the series-arm circuits, and the first inductor and to a reference terminal; and
        one or more other parallel-arm resonators that are connected to nodes in a path between the first series-arm circuit and the second terminal and to the reference terminal;
    an anti-resonant frequency of the first parallel-arm resonator is within the second pass band; and
    a resonant frequency of the first parallel-arm resonator is lower than a high end frequency of the first pass band and is lower than any resonant frequencies of the one or more other parallel-arm resonators.

2. The composite filter apparatus according to claim 1, wherein
    the second filter includes a first parallel-arm resonant circuit; and
    the first parallel-arm resonant circuit includes a second inductor provided in a path between the first parallel-arm resonator and the reference terminal to which the first parallel-arm resonator is connected.

3. The composite filter apparatus according to claim 2, wherein the second inductor is provided only on the path between the first parallel-arm resonator and the reference terminal to which the first parallel-arm resonator is connected.

4. The composite filter apparatus according to claim 2, wherein a resonant frequency of the first parallel-arm resonant circuit is lower than a low end frequency of the first pass band.

5. The composite filter apparatus according to claim 1, wherein at least a portion of impedance when the second filter alone is viewed from the common terminal side is in an open state in the first pass band.

6. The composite filter apparatus according to claim 1, wherein
the first filter includes a plurality of resonators; and
among the plurality of resonators in the first filter, a resonator closest to the common terminal is a series-arm resonator.

7. The composite filter apparatus according to claim 1, further comprising:
a third terminal;
a third filter that is connected between the common terminal and the third terminal and that has a third pass band higher than the second pass band; and
a third inductor that is provided between the common terminal and the third filter;
the third filter includes one or more series-arm circuits and two or more parallel-arm resonators;
the one or more series-arm circuits in the third filter are connected in a path between the common terminal and the third terminal in series to each other;
the two or more parallel-arm resonators in the third filter include:
a second parallel-arm resonator that is connected to a node in a path between a second series-arm circuit closest to the common terminal, among the one or more series-arm circuits in the third filter, and the third inductor and to the reference terminal; and
one or more other parallel-arm resonators that are connected to nodes in a path between the second series-arm circuit and the third terminal and to the reference terminal;
a fourth inductor is provided in a path between the second parallel-arm resonator and the reference terminal to which the second parallel-arm resonator is connected;
at least the second parallel-arm resonator and the fourth inductor define a second parallel-arm resonant circuit;
an anti-resonant frequency of the second parallel-arm resonant circuit is within the third pass band; and
a resonant frequency of the second parallel-arm resonant circuit is lower than the high end frequency of the first pass band and is lower than the resonant frequencies of the one or more other parallel-arm resonators in the third filter.

8. The composite filter apparatus according to claim 7, wherein the resonant frequency of the second parallel-arm resonant circuit is lower than the low end frequency of the first pass band.

9. A high-frequency front end circuit comprising:
the composite filter apparatus according to claim 1; and
an amplifier circuit connected to the composite filter apparatus.

10. The high-frequency front end circuit according to claim 9, wherein
the second filter includes a first parallel-arm resonant circuit; and
the first parallel-arm resonant circuit includes a second inductor provided in a path between the first parallel-arm resonator and the reference terminal to which the first parallel-arm resonator is connected.

11. The high-frequency front end circuit according to claim 10, wherein the second inductor is provided only on the path between the first parallel-arm resonator and the reference terminal to which the first parallel-arm resonator is connected.

12. The high-frequency front end circuit according to claim 10, wherein a resonant frequency of the first parallel-arm resonant circuit is lower than a low end frequency of the first pass band.

13. The high-frequency front end circuit according to claim 9, wherein at least a portion of impedance when the second filter alone is viewed from the common terminal side is in an open state in the first pass band.

14. The high-frequency front end circuit according to claim 9, wherein
the first filter includes a plurality of resonators; and
among the plurality of resonators in the first filter, a resonator closest to the common terminal is a series-arm resonator.

15. The high-frequency front end circuit according to claim 9, further comprising:
a third terminal;
a third filter that is connected between the common terminal and the third terminal and that has a third pass band higher than the second pass band; and
a third inductor that is provided between the common terminal and the third filter;
the third filter includes one or more series-arm circuits and two or more parallel-arm resonators;
the one or more series-arm circuits in the third filter are connected in a path between the common terminal and the third terminal in series to each other;
the two or more parallel-arm resonators in the third filter include:
a second parallel-arm resonator that is connected to a node in a path between a second series-arm circuit closest to the common terminal, among the one or more series-arm circuits in the third filter, and the third inductor and to the reference terminal; and
one or more other parallel-arm resonators that are connected to nodes in a path between the second series-arm circuit and the third terminal and to the reference terminal;
a fourth inductor is provided in a path between the second parallel-arm resonator and the reference terminal to which the second parallel-arm resonator is connected;
at least the second parallel-arm resonator and the fourth inductor define a second parallel-arm resonant circuit;
an anti-resonant frequency of the second parallel-arm resonant circuit is within the third pass band; and
a resonant frequency of the second parallel-arm resonant circuit is lower than the high end frequency of the first pass band and is lower than the resonant frequencies of the one or more other parallel-arm resonators in the third filter.

16. The high-frequency front end circuit according to claim 15, wherein the resonant frequency of the second parallel-arm resonant circuit is lower than the low end frequency of the first pass band.

17. A communication apparatus comprising:
a radio-frequency signal processing circuit that processes high-frequency signals transmitted and received with an antenna element; and the high-frequency front end circuit according to claim 9, which transfers the high-frequency signals between the antenna element and the radio-frequency signal processing circuit.

18. The communication apparatus according to claim 17, wherein the second filter includes a first parallel-arm resonant circuit; and the first parallel-arm resonant circuit includes a second inductor provided in a path between the first parallel-arm resonator and the reference terminal to which the first parallel-arm resonator is connected.

19. The communication apparatus according to claim 18, wherein the second inductor is provided only on the path between the first parallel-arm resonator and the reference terminal to which the first parallel-arm resonator is connected.

20. The communication apparatus according to claim 18, wherein a resonant frequency of the first parallel-arm resonant circuit is lower than a low end frequency of the first pass band.

* * * * *